United States Patent
Chang et al.

(10) Patent No.: US 11,457,542 B2
(45) Date of Patent: Sep. 27, 2022

(54) RETRACTABLE BAFFLE FOR A BAY

(71) Applicant: Quanta Computer Inc., Taoyuan (TW)

(72) Inventors: Chun Chang, Taoyuan (TW); Wei-Pin Chen, Taoyuan (TW); Chin-Tien Huang, Taoyuan (TW); Jyue Hou, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/183,735

(22) Filed: Feb. 24, 2021

(65) Prior Publication Data

US 2022/0272870 A1    Aug. 25, 2022

(51) Int. Cl.
*H05K 7/20* (2006.01)
*F04D 25/14* (2006.01)
*G06F 1/20* (2006.01)

(52) U.S. Cl.
CPC ......... *H05K 7/20145* (2013.01); *F04D 25/14* (2013.01); *G06F 1/20* (2013.01); *H05K 7/20172* (2013.01)

(58) Field of Classification Search
CPC .......... H05K 7/20145; H05K 7/20172; H05K 7/20581; F28F 13/06; G06F 1/20; F04D 25/14
See application file for complete search history.

(56) References Cited

U.S. PATENT DOCUMENTS 10,238,006 B2 * 3/2019 Huang .................. F04D 29/601
10,588,241 B2 * 3/2020 Goergen ............. G05D 7/0676
10,852,029 B2 * 12/2020 Tsai ....................... F24F 13/075

* cited by examiner

*Primary Examiner* — Zachary Pape
(74) *Attorney, Agent, or Firm* — Nixon Peabody LLP

(57) ABSTRACT

A system is disclosed that includes a bay within a computer system, such as a fan bay. The system further includes a baffle positioned around a section of a perimeter of the bay. The baffle is configured to move along the section. The baffle includes a projection that extends into the bay. The projection is configured to abut against a module, such as a fan module, so that the module drives the baffle from a closed position to an open position as the module is inserted into the bay.

18 Claims, 3 Drawing Sheets

RETRACTABLE BAFFLE FOR A BAY

FIELD OF THE INVENTION

The present invention relates to controlling airflow within a computer system, and specifically to a baffle that is configured to retract in response to insertion of a module, such as a fan module, within a bay of the computer system, such as a fan bay.

BACKGROUND

In current server architecture, when a fan module is withdrawn from a fan bay within a computer system, airflow may escape from the fan bay. This escaping airflow is undesirable. To prevent this, modules that do not have any functionality ("dumb modules") are inserted into the fan bay to block the airflow. However, insertion of these "dumb modules" is performed by users, which presents the possibility of a user incorrectly withdrawing the wrong "dumb module." This may result in the computer system shutting down.

Accordingly, there is a need for a way to block unwanted airflow leakage such that insertion of an additional module into the fan bay is not required. Aspects of the present disclosure solve this and other problems.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter; nor is it intended to be used in isolation to determine the scope of the claimed subject matter. The subject matter should be understood by reference to appropriate portions of the entire specification of this disclosure, any or all drawings and each claim.

According to one embodiment, a system is disclosed that includes a fan bay within a computer system. The system further includes a baffle positioned around a section of a perimeter of the fan bay. The baffle is configured to move along the section. The baffle further includes a projection that extends into the fan bay. The projection is configured to abut against a fan module so that the fan module drives the baffle from a closed position to an open position as the fan module is inserted into the fan bay.

According to an aspect of the embodiment, the system further includes one or more rollers along the section of the perimeter of the fan bay. The one or more rollers are configured to guide the baffle around the section of the perimeter as the baffle moves between the closed position and the open position. According to another aspect of the embodiment, the one or more rollers are positioned at one or more corners of the section of the perimeter. According to another aspect of the embodiment, a weight is connected to the baffle at an end of the baffle opposite from the projection. The weight is configured to drive the baffle back to the closed position upon the fan module being withdrawn from the fan bay. According to another aspect of the embodiment, the baffle is formed of, at least in part, a plurality of cylinders connected by a flexible material. According to another aspect of the embodiment, the system further includes one or more rollers at one or more corners of the section of the perimeter of the fan bay. The diameters of the plurality of cylinders are less than diameters of the one or more rollers. According to another aspect of the embodiment, the fan bay defines an airflow passage. The baffle in the closed position closes the airflow passage. The baffle in the open position opens the airflow passage with the fan module inserted in the fan bay. According to another aspect of the embodiment, the section of the perimeter includes a first portion perpendicular to an airflow direction through the fan bay and a second portion parallel to the airflow direction. According to another aspect of the embodiment, a length of the first portion is substantially equal to a depth the fan module is inserted into the fan bay. According to another aspect of the embodiment, a width of the baffle is substantially equal to a width of the fan module. According to another aspect of the embodiment, the system includes a track on opposite sides of the section of the perimeter of the fan bay. The baffle sits and travels within the track between the closed position and the open position.

According to another embodiment, a system is disclosed that includes a bay within a computer system. The system further includes a baffle positioned around a section of a perimeter of the bay. The baffle includes a projection that extends into the bay. The system further includes a weight connected to the baffle at an end of the baffle opposite from the projection. The projection is configured to abut against a module upon the module being inserted into the bay, which causes the baffle to move from a closed position to an open position. The weight is configured to drive the baffle to the closed position upon withdrawal of the module from the bay.

According to an aspect of the embodiment, the system further includes one or more rollers along the section of the perimeter of the bay. The one or more rollers are configured to guide the baffle around the section of the perimeter as the baffle moves between the closed position and the open position. According to another aspect of the embodiment, the baffle is formed of, at least in part, a plurality of cylinders connected by a flexible material. Diameters of the plurality of cylinders are less than diameters of the one or more rollers. According to another aspect of the embodiment, the one or more rollers are at one or more corners of the section of the perimeter. According to another aspect of the embodiment, the section of the perimeter includes a vertical portion and a horizontal portion. A length of the vertical portion is substantially equal to a depth the module is inserted into the bay. A width of the baffle is substantially equal to a width of the module. According to another aspect of the embodiment, the system includes a track that defines opposite sides of at least part of the section of the perimeter of the fan bay. According to another aspect of the embodiment, the baffle sits and travels within the track between the closed position and the open position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of embodiments together with reference to the accompanying drawings. These drawings depict only embodiments, and are therefore not to be considered as limitations on the scope of the various embodiments or claims.

Figure 1:
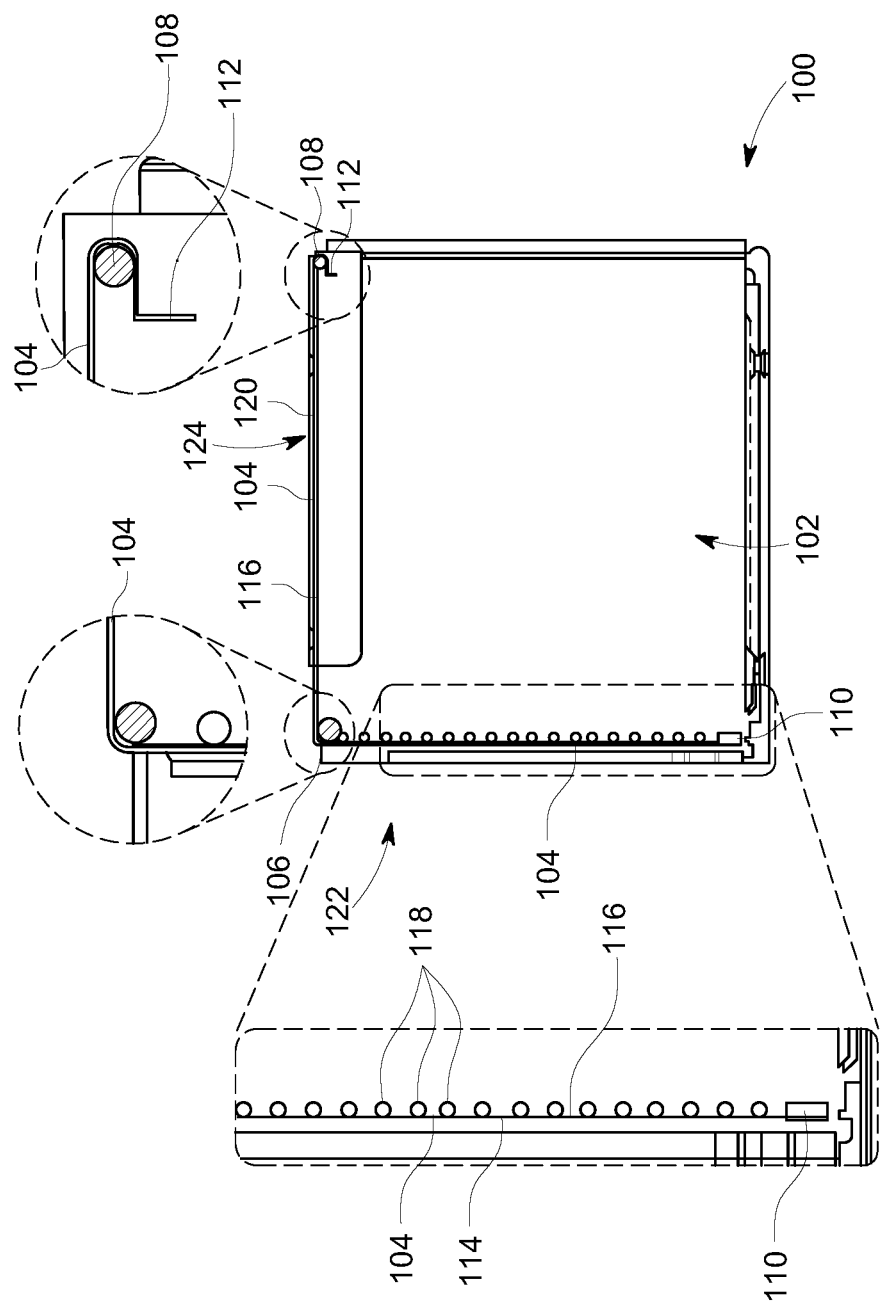
FIG. 1 is a side view of a bay of a computer system equipped with a baffle, according to aspects of the present disclosure.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 2:
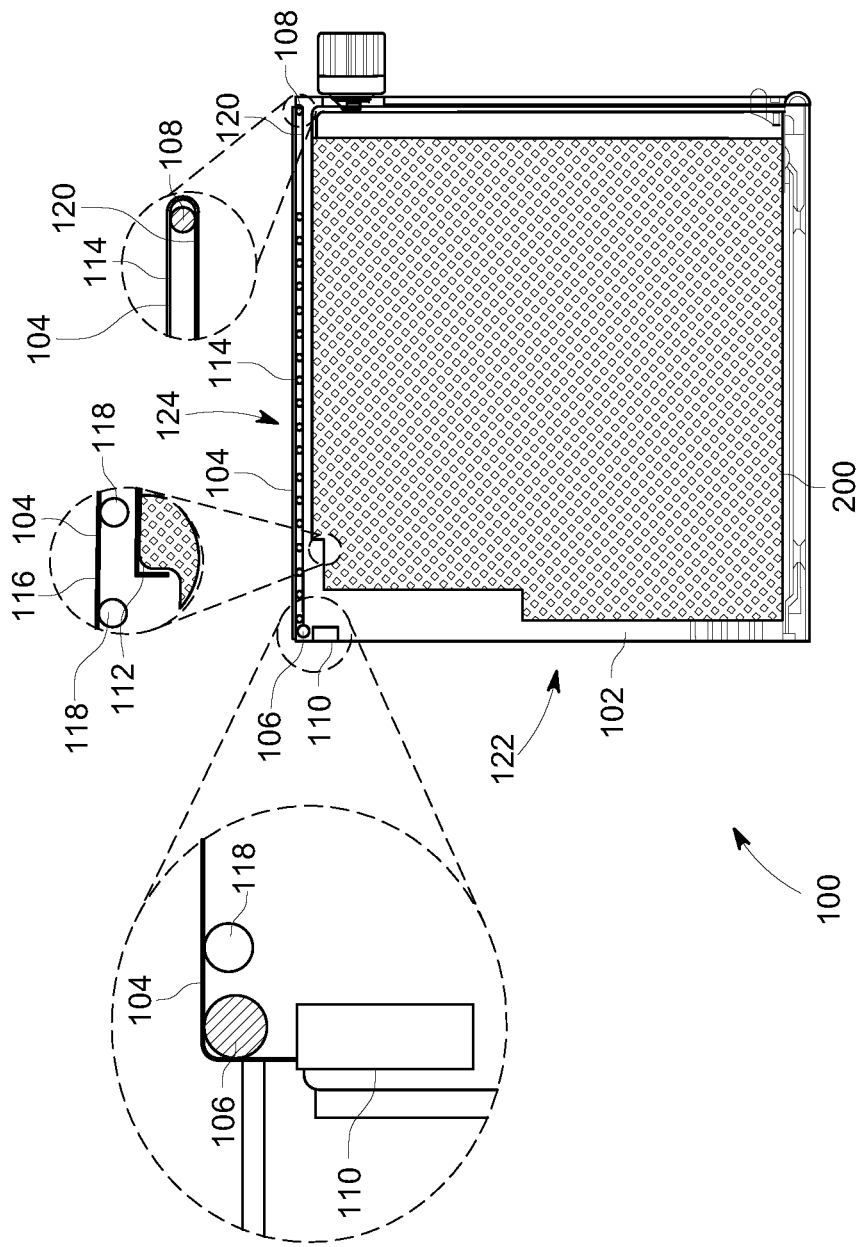
FIG. 2 is a side view of the bay shown in FIG. 1 housing a module, according to aspects of the present disclosure.
Figure 3:
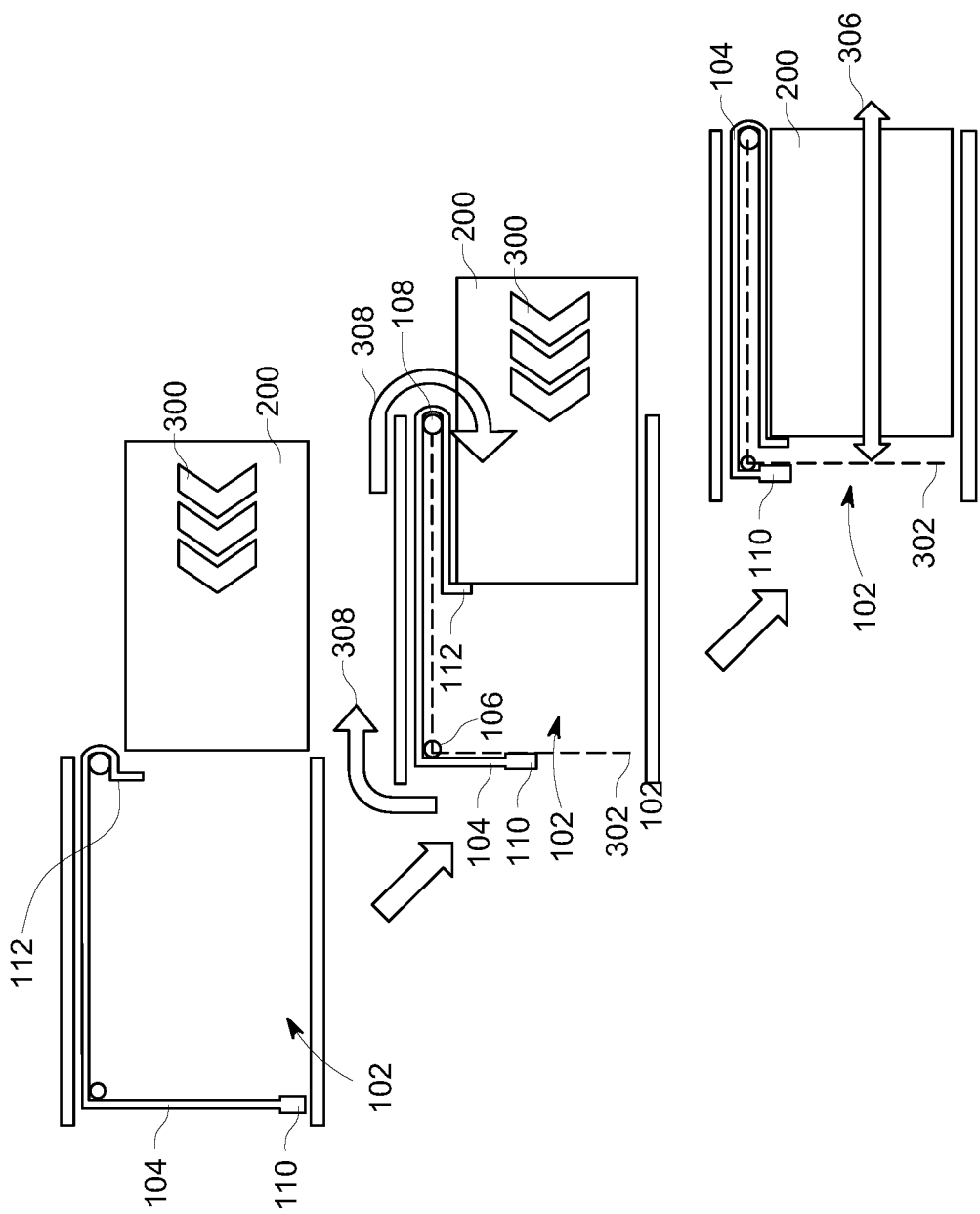
FIG. 3 illustrates steps of inserting a fan module into the fan bay equipped with the baffle shown in FIGS. 1 and 2, according to aspects of the present disclosure.

FIG. 1 is a partial side view of a computer system 100, according to aspects of the present disclosure. More specifically, FIG. 1 illustrates a fan bay 102 of the computer system 100. The fan bay 102 in FIG. 1 is empty but is configured to hold a fan module, as described below (FIGS. 2 and 3). The fan bay 102 is further configured to allow airflow through the fan bay 102, generally in a right-to-left or left-to-right direction relative to the view in FIG. 1. Thus, the fan bay 102 is open on the left and right sides in FIG. 1. Moreover, the fan bay 102 is configured to accept a fan module inserted into the fan bay 102 from the right side, as shown in FIGS. 2 and 3. The fan bay 102 is generally sized slightly larger than a corresponding fan module. This allows the fan bay 102 to accommodate the fan module but still remain compact so as to not take up much space in the computer system 100. However, the fan bay 102 can be at least as deep as the fan module or deeper.

The fan bay 102 includes a baffle 104. The baffle 104 surrounds a section of the perimeter 122 of the fan bay 102. In one or more embodiments, the perimeter 122 of the fan bay 102 is generally the area surrounding the fan module (not shown) when the fan module is inserted into the fan bay 102, as described below (FIGS. 2 and. 3). However, in one or more embodiments, the perimeter 122 of the fan bay 102 can be larger than the general area of the fan module.

The fan bay 102 includes a roller 106 and a roller 108 that generally define corners of the perimeter 122 of the fan bay 102. In one or more embodiments, the rollers 106 and 108 also generally define, at least in part, a track 124 within which the baffle 104 sits and moves within the fan bay 102. More specifically, the baffle 104 is positioned around the roller 106 and the roller 108. As described in greater detail below (FIG. 3), the roller 106 and the roller 108 guide the baffle 104 when the baffle 104 moves between a closed position, as shown in FIG. 1, and an open position, as shown in FIG. 2 below.

In one or more embodiments, each of the rollers 106 and 108 span the width of the fan bay 102. Alternatively, in one or more embodiments, each of the rollers 106 and 108 is a pair of rollers, with one roller for each pair of the rollers 106 and 108 on opposite sides of the fan bay 102.

The top-left detailed view in FIG. 1 shows the baffle 104 positioned around the roller 106. The baffle 104 makes generally a 90-degree turn around the roller 106. The top-right detailed view in FIG. 1 shows the baffle 104 positioned around the roller 108. The baffle 104 makes generally a 180-degree turn around the roller 108.

As shown in the FIG. 1, and more specifically in the left-detailed view, the baffle 104 includes a weight 110. The weight 110 drives the baffle 104 returning to the closed position illustrated in FIG. 1 when a fan module (not shown) is withdrawn from the fan bay 102, as described below (FIG. 3). The weight 110 is used rather than a spring, for example, to reduce the surface area that would obstruct airflow with the baffle 104 in the open position (FIG. 2).

As shown in the top-right detailed view of FIG. 1, the baffle 104 incudes a projection 112 generally opposite from the weight 110. The projection 112 extends into the fan bay 102 from the baffle 104. The projection 112 is configured to abut against a fan module when the fan module is inserted into the fan bay 102, as described below (FIGS. 2 and 3).

In the position illustrated in FIG. 1, which is generally the closed position, the baffle 104 includes a first portion 114 that is generally the vertical portion of the baffle 104. The first portion 114 includes a flexible sheet 116 with ribs 118. The flexible sheet 116 can be formed of any material that generally restricts airflow and that is flexible so as to be positioned around the roller 106 and the roller 108. The ribs 118 can be formed of any material that provides additional rigidity to the baffle 104 in the first portion 114. The rigidity allows the baffle 104 to withstand a difference in pressure on opposite sides of the baffle 104.

The flexible sheet 116 can be a continuous sheet across the length of the first portion 114. The ribs 118 can be connected to the flexible sheet 116, either on the inside of the baffle 104 relative to the center of the fan bay 102 or on the outside of the baffle 104 relative to the center of the fan bay 102. The position of the ribs 118 on the outside of the baffle 104 assists the ribs 118 traversing around the roller 106. Alternatively, the flexible sheet 116 can be formed of sheet segments connected together by the ribs 118.

In one or more embodiments, the ribs 118 are generally in the shape of cylinders. In one or more embodiments, the diameters of the cylinders are less than the diameter of the roller 106. This aids the cylindrical ribs 118 traveling over the roller 106 as the baffle 104 moves from the closed position (FIG. 1) to the open position (FIG. 2), particularly if ribs 118 are on the inside of the baffle 104.

In the position illustrated in FIG. 1, which again is generally described as the closed position, the baffle 104 includes a second portion 120 that is generally horizontally positioned around the baffle 104. The second portion 120 can be formed of the same arrangement of the flexible sheet 116 and the ribs 118 as the first portion 114. Alternatively, and as illustrated in FIG. 1, the second portion 120 can be formed only of the flexible sheet 116. Being formed only of the flexible sheet 116 for the second portion 120 aids the baffle 104 travel around the roller 108 as the baffle 104 moves from the closed position (FIG. 1) to the open position (FIG. 2).

FIG. 2 is a side view of the bay 102 of the computer system 100 in FIG. 1 housing a fan module 200, according to aspects of the present disclosure. Because the fan module 200 is inserted into the fan bay 102, the baffle 104 is generally in the open position.

Referring to the middle-detailed view in FIG. 2, the fan module 200 abuts against the projection 112. Insertion of the fan module 200 into the fan bay 102 with the fan module 200 abutting the projection 112 drives the baffle 104 into the open position shown in FIG. 2, as described below (FIG. 3). In the open position, a majority of the first portion 114 of the baffle 104 is generally parallel to the second portion 120 of the baffle 104. More specifically, the majority of the first portion 114 of the baffle 104 traversed around the roller 106 in response to the insertion of the fan module 200 into the fan bay 102 such that the first portion 114 is now generally horizontal. Similarly, and referring to the right-detailed view, a majority of the second portion 120 of the baffle 104 traversed around the roller 108 in response to the insertion of the fan module 200 such that the second portion 120 remains horizontal and is now below the first portion 114.

Referring to the left-detailed view in FIG. 2, the weight 110 has not traversed around the roller 106 with the baffle 104 in the open position. Instead, the weight 110 remains generally in the same vertical arrangement as shown in FIG. 1, but closer to the roller 106. This enables the weight 110 to move in a downward direction due to gravity, thereby driving the baffle 104 back to the closed position (FIG. 1) upon withdrawal of the fan module 200.

FIG. 3 illustrates the steps of inserting the fan module 200 into the fan bay 102, according to aspects of the present disclosure. Starting from the top-left view in FIG. 3, the baffle 104 is initially in the closed position relative to the fan bay 102. As disclosed above, the baffle 104 generally restricts or limits airflow through the fan bay 102 in the closed position. The weight 110 is generally in the lowest position and closest to the bottom of the fan bay 102. The projection 112 is generally at the closest position relative to the opening in the fan bay 102. As shown, the fan module 200 is brought toward the fan bay 102 in the direction of the arrowheads 300.

Referring to the center view in FIG. 3, as the fan module 200 is inserted into the fan bay 102, the fan module 200 contacts the projection 112, thereby forcing the projection 112 to advance inward relative to the fan bay 102, in the direction of the arrowheads 300. This drives the baffle 104 around the perimeter 122 of the fan bay 102, generally designated by the dotted line 302, and in the direction of arrows 308. As disclosed above, the baffle 104 wraps around the rollers 106 and 108 at the corners of the perimeter 302. As the baffle 104 advances around the perimeter 302, the weight 110 rises up.

Referring to the bottom-right view in FIG. 3, with the fan module 200 fully inserted into the fan bay 102, the baffle 104 is in the open position within the fan bay 102. The baffle 104 in the open position allows airflow through the fan bay 102 in one or both directions, as represented by the double arrow 306. The weight 110 remains generally along the vertical portion of the perimeter 302, thereby allowing gravity to drive the baffle 104 downward and back to the closed position (the top-left view in FIG. 3) upon withdrawal of the fan module 200 from the fan bay 102. The force of gravity on the weight 110 is enough to overcome the static force of friction on the baffle 104 within the fan bay 102 and also any force applied to the baffle 104 as a result of a difference in pressure on opposite sides of the baffle 104, as the baffle 104 begins to advance towards the closed position. Withdrawal of the fan module 200 causes the above steps to occur in reverse until the weight 110 is back to the lowest position and the baffle 104 is in the closed position, as shown in the top-left view of FIG. 3.

Although disclosed throughout a generally being a baffle within a fan bay of a computer system, aspects of the present disclosure can be applied to any bay within a computer system. For example, the baffle can instead be applied to a bay that accepts one or more modules within a computer system besides a fan module, such as a memory module, a storage module, a power module, etc. Differences in air pressure inside and outside of computer systems may cause unwanted airflow in various bays of a computer system that are not configured specifically as fan bays. Thus, according to some embodiments of the present disclosure, the disclosed baffle may be incorporated within other bays configured to accept other types of modules. In such embodiments, the baffle would have the same configuration and description as disclosed above with respect to FIGS. 1-3, but in the context of a different module being inserted into the bay.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A system comprising:
    a fan bay within a computer system;
    a baffle positioned around a section of a perimeter of the fan bay and configured to move along the section, the baffle including a projection that extends into the fan bay; and
    one or more rollers along the section of the perimeter of the fan bay, the one or more rollers being configured to guide the baffle around the section of the perimeter as the baffle moves between a closed position and an open position,
    wherein the projection is configured to abut against a fan module so that the fan module drives the baffle from the closed position to the open position as the fan module is inserted into the fan bay.

2. The system of claim 1, wherein the one or more rollers are at one or more corners of the section of the perimeter.

3. The system of claim 1, further comprising:
    a weight connected to the baffle at an end of the baffle opposite from the projection,
    wherein the weight is configured to drive the baffle back to the closed position upon the fan module being withdrawn from the fan bay.

4. The system of claim 1, wherein the baffle is formed of, at least in part, a plurality of cylinders connected by a flexible material.

5. The system of claim 4, wherein:
    the one or more rollers are positioned at one or more corners of the section of the perimeter of the fan bay, and
    diameters of the plurality of cylinders are less than diameters of the one or more rollers.

6. The system of claim 1, wherein the fan bay defines an airflow passage, the baffle in the closed position closes the airflow passage, and the baffle in the open position opens the airflow passage with the fan module inserted in the fan bay.

7. The system of claim 1, wherein the section of the perimeter includes a first portion perpendicular to an airflow direction through the fan bay and a second portion parallel to the airflow direction.

8. The system of claim 7, wherein a length of the first portion is substantially equal to a depth the fan module is inserted into the fan bay.

9. The system of claim 1, wherein a width of the baffle is substantially equal to a width of the fan module.

10. The system of claim 1, further comprising:
    a track on opposite sides of the section of the perimeter of the fan bay,
    wherein the baffle sits and travels within the track between the closed position and the open position.

11. A system comprising: a bay within a computer system; a baffle positioned around a section of a perimeter of the bay, the baffle including a projection that extends into the bay; a weight connected to the baffle at an end of the baffle opposite from the projection; and one or more rollers along the section of the perimeter of the fan bay, the one or more rollers being configured to guide the baffle around the section of the perimeter as the baffle moves between a closed position and an open position, wherein the projection is configured to abut against a module upon the module being inserted into the bay, which causes the baffle to move from the closed position to the open position, and the weight is configured to drive the baffle to the closed position upon withdrawal of the module from the bay.

12. The system of claim 11, wherein the baffle is formed of, at least in part, a plurality of cylinders connected by a flexible material, and diameters of the plurality of cylinders are less than diameters of the one or more rollers.

13. The system of claim 11, wherein the one or more rollers are positioned at one or more corners of the section of the perimeter.

14. The system of claim 11, wherein the section of the perimeter includes a vertical portion and a horizontal portion.

15. The system of claim 14, wherein a length of the vertical portion is substantially equal to a depth the module is inserted into the bay.

16. The system of claim 11, wherein a width of the baffle is substantially equal to a width of the module.

17. The system of claim 11, further comprising:
    a track defining opposite sides of at least part of the section of the perimeter of the bay.

18. The system of claim 17, wherein the baffle sits and travels within the track between the closed position and the open position.

* * * * *